US012767856B2

(12) United States Patent
Ito

(10) Patent No.: US 12,767,856 B2
(45) Date of Patent: Oct. 20, 2026

(54) POLISHING COMPOSITION, POLISHING METHOD, AND METHOD OF MANUFACTURING SEMICONDUCTOR SUBSTRATE

(71) Applicant: FUJIMI INCORPORATED, Kiyosu (JP)

(72) Inventor: Daiki Ito, Kiyosu (JP)

(73) Assignee: FUJIMI INCORPORATED, Kiyosu (JP)

( * ) Notice: Subject to any disclaimer, the term of this patent is extended or adjusted under 35 U.S.C. 154(b) by 0 days.

(21) Appl. No.: 18/820,001

(22) Filed: Aug. 29, 2024

(65) Prior Publication Data

US 2025/0109318 A1 Apr. 3, 2025

(30) Foreign Application Priority Data

Sep. 29, 2023 (JP) ................................ 2023-169594

(51) Int. Cl.
*C09G 1/02* (2006.01)
*C09K 3/14* (2006.01)
*H10P 52/40* (2026.01)

(52) U.S. Cl.
CPC .............. *C09G 1/02* (2013.01); *C09K 3/1436* (2013.01); *H10P 52/402* (2026.01)

(58) Field of Classification Search
None
See application file for complete search history.

(56) References Cited

U.S. PATENT DOCUMENTS

| | | | | |
|---|---|---|---|---|
| 2014/0094033 | A1 | 4/2014 | Yamato et al. | |
| 2016/0068713 | A1* | 3/2016 | Kitamura | C09G 1/00 252/79.1 |
| 2020/0299543 | A1* | 9/2020 | Ishida | B24B 37/044 |
| 2022/0348791 | A1* | 11/2022 | Suzuki | C09G 1/02 |

FOREIGN PATENT DOCUMENTS

| | | |
|---|---|---|
| JP | 2013-21292 A | 1/2013 |

* cited by examiner

*Primary Examiner* — Shamim Ahmed
(74) *Attorney, Agent, or Firm* — Foley & Lardner LLP

(57) ABSTRACT

The present invention provides a mechanism capable of reducing a polishing removal rate of polysilicon and further reducing defects (organic residues, for example) on a surface of polysilicon after polishing. The present invention is a polishing composition containing: abrasive grains; a removal rate inhibitor that reduces a polishing removal rate of polysilicon; and a defect reducing agent that reduces defects on a surface of polysilicon, wherein the removal rate inhibitor is a water-soluble polymer having a polyoxyalkylene chain, which has a number average molecular weight of 200 or more and 600 or less, and in which a content of a component with a molecular weight of 700 or more is more than 0% by mass and less than 1% by mass.

12 Claims, No Drawings

POLISHING COMPOSITION, POLISHING METHOD, AND METHOD OF MANUFACTURING SEMICONDUCTOR SUBSTRATE

BACKGROUND

1. Technical Field

The present invention relates to a polishing composition, a polishing method, and a method of manufacturing a semiconductor substrate.

2. Description of Related Arts

In recent years, novel microfabrication technologies have been developed with increases in integration and performance of LSI (Large Scale Integration). A Chemical Mechanical Polishing (CMP) method is one of the technologies and is a technology that is frequently used in planarization of an interlayer insulating film, metal plug formation, and embedded wiring (damascene wiring) formation in an LSI manufacturing process, particularly, a multilayer wiring formation process.

CMP has been applied to each process in semiconductor manufacturing, and as one aspect thereof, an application to a gate forming process in transistor fabrication, for example, can be exemplified. When a transistor is produced, a silicon-containing material such as silicon, silicon oxide ($SiO_2$), polysilicon (polycrystalline silicon), or silicon nitride ($Si_3N_4$) may be polished.

As a technology for polishing such a silicon-containing material, Japanese Patent Application Laid-Open No. 2013-21292 (corresponding to US Patent Application Publication No. 2014/0094033 A), for example, discloses a polishing composition containing an abrasive grain having a silanol group and a nonionic water-soluble polymer having a polyoxyalkylene chain, in which 5000 or more molecules of the water-soluble polymer are adsorbed per 1 $\mu m^2$ of a surface area of the abrasive grain when the polishing composition is left standing for one day in an environment at a temperature of 25° C.

SUMMARY

Although an effect of reducing a polishing removal rate of polysilicon can be obtained by the technology described in Japanese Patent Application Laid-Open No. 2013-21292 (corresponding to US Patent Application Publication No. 2014/0094033), a phenomenon in which the reduction of defects (organic residues, for example) on an object to be polished after polishing (an object to be polished that has already been polished) is insufficient is observed, and there is room for improvement in this regard.

Thus, an object of the present invention is to provide a mechanism capable of reducing a polishing removal rate of polysilicon and further reducing defects (organic residues, for example) on a surface of polysilicon after polishing.

The present inventor has conducted intensive studies in view of the above problems. As a result, the present inventors have found that the above problems are solved by a polishing composition containing abrasive grains, a removal rate inhibitor that reduces a polishing removal rate of polysilicon, and a defect reducing agent that reduces defects on a surface of polysilicon, in which the removal rate inhibitor is a water-soluble polymer having a polyoxyalkylene chain, a number average molecular weight of which is 200 or more and 600 or less, in which a content of a component with a molecular weight of 700 or more is more than 0% by mass and less than 1% by mass, and have completed the present invention.

DETAILED DESCRIPTION

According to an embodiment of the present invention there is provided a polishing composition containing: abrasive grains; a removal rate inhibitor that reduces a polishing removal rate of polysilicon; and a defect reducing agent that reduces defects on a surface of polysilicon, in which the removal rate inhibitor is a water-soluble polymer having a polyoxyalkylene chain, a number average molecular weight of which is 200 or more and 600 or less, in which content of a component with a molecular weight of 700 or more is more than 0% by mass and less than 1% by mass. According to such a polishing composition of the present invention, it is possible to reduce a polishing removal rate of polysilicon and to further reduce defects (organic residues, for example) on a surface of polysilicon after polishing.

It is known that a water-soluble polymer having a polyoxyalkylene chain has an action of reducing a polishing removal rate of polysilicon. However, according to the technology described in Japanese Patent Application Laid-Open No. 2013-21292 (corresponding to US Patent Application Publication No. 2014/0094033), a phenomenon in which reduction of defects (organic residues, for example) on an object to be polished after polishing (an object to be polished that has already been polished) is insufficient is observed, and there is room for improvement in this regard.

In view of such a phenomenon, the present inventor has continued intensive studies. As a result, the present inventor has discovered that the above problem is surprisingly solved by using, as a removal rate inhibitor for reducing a polishing removal rate of polysilicon, a water-soluble polymer, a number average molecular weight of which is 200 or more and 600 or less, the water-soluble polymer containing a small amount of a component with a molecular weight of 700 or more (content thereof is more than 0% by mass and less than 1% by mass) and having a polyoxyalkylene chain. In other words, the present inventor has discovered that a polishing composition that is capable of reducing a polishing removal rate of polysilicon and is excellent in reduction of defects (organic residues, for example) on the surface of polysilicon after polishing can be obtained, and has completed the present invention.

Although embodiments of the present invention will be described below in detail, the present invention is not limited only to the following embodiments, and various modifications can be made within the scope of the claims. The embodiments described in the specification may be other embodiments by being arbitrarily combined. Unless otherwise particularly specified in the specification, operations and measurements of physical properties and the like are performed under conditions of room temperature (equal to or greater than 20° C. and equal to or less than 25° C.)/relative humidity of equal to or greater than 40% RH and equal to or less than 50% RH.

In the specification, residues represent foreign matters adhering to a surface of an object to be polished that has already been polished. Examples of the residues are not particularly limited and include other residues such as organic residues, particle residues derived from abrasive grains contained in the polishing composition, residues composed of components other than the particle residues and the organic residues, mixtures of the particle residues and the organic residues, and the like.

In the specification, the organic residues represent components composed of organic substances such as organic low molecular weight compounds and polymer compounds, organic salts, and the like among foreign matters adhering to the surface of the object to be polished that has already been polished. Examples of the organic residues adhering to the object to be polished that has already been polished include pad debris generated from a pad used in a polishing process described later, components derived from additives contained in the polishing composition used in the polishing process, and the like.

Note that since the organic residues and other residues are greatly different in color and shape, determination regarding whether or not the residues are organic residues can be visually performed through scanning electron microscope (SEM) observation, for example. In addition, the determination regarding whether or not the residues are organic residues may be performed by elemental analysis using an energy dispersive X-ray analyzer (EDX) attached to the SEM as needed, The number of organic residues can be measured using a wafer defect inspection apparatus or using an SEM and/or an EDX together with the wafer defect inspection apparatus. Specifically, it can be measured by a method described in examples.

In the specification, the term "water-soluble" means that the solubility in water (25° C.) is equal to or greater than 1 g/100 mL, and the term "polymer" refers to a (co)polymer, at least one of a weight average molecular weight (Mw) and a number average molecular weight (Mn) of which is equal to or greater than 200.

[Abrasive Grains]

The polishing composition according to the present invention contains abrasive grains. The abrasive grains have an action of mechanically polishing the object to be polished and improve the polishing removal rate of the object to be polished by the polishing composition.

Examples of the type of abrasive grains used in the polishing composition according to the present invention include metal oxides such as silica, alumina, zirconia, and titania. As the abrasive grains, one kind may be used alone, or two or more kinds may be used in combination. As the abrasive grains, a commercially available product may be used, or a synthesized product may be used.

The type of abrasive grains is preferably silica, and is more preferably colloidal silica. Examples of a method for manufacturing colloidal silica include a sodium silicate method and a sol-gel method, and any colloidal silica produced by any manufacturing method is suitably used as the colloidal silica according to the present invention. However, the abrasive grains are preferably colloidal silica manufactured by the sol-gel method from the viewpoint of reducing metal impurities. The colloidal silica manufactured by the sol-gel method is preferable because the content of metal impurities having a characteristic of being diffused in a semiconductor and corrosive ions such as chloride ions therein is small. The manufacturing of the colloidal silica by the sol-gel method can be performed using a conventionally known method, and specifically, colloidal silica can be obtained by performing a hydrolysis/condensation reaction using a hydrolyzable silicon compound (alkoxysilane or a derivative thereof, for example) as a raw material. Also, a commercially available product may be used as colloidal silica.

The shape of the colloidal silica is not particularly limited and may be a spherical shape or a non-spherical shape. Specific examples of the non-spherical shape include various shapes such as a polygonal prism shape such as a triangular prism and a quadrangular prism, a columnar shape, a Japanese straw ricebag shape in which a central portion of a cylinder bulges more than end portions, a donut shape in which a central portion of a disk has been pierced, a plate shape, a so-called cocoon shape having a constriction at the central portion, a so-called associated spherical shape in which a plurality of particles are integrated, a so-called kompeito-shape having a plurality of protrusions on a surface, and a rugby ball shape, and are not particularly limited.

In the polishing composition of the present invention, the colloidal silica may have a cationic group on the surface. In other words, the colloidal silica may be cationically modified colloidal silica (cation-modified colloidal silica). As the cathionically modified colloidal silica, colloidal silica with an amino group immobilized on a surface is a preferable example. Examples of a method for manufacturing such colloidal silica having a cationic group include a method for immobilizing a silane coupling agent having an amino group such as aminoethyltrimethoxysilane, aminopropyltrimethoxysilane, aminoethyltriethoxysilane, aminopropyltriethoxysilane, aminopropyldimethylethoxysilane, aminopropylmethyldiethoxysilane, or aminobutyltriethoxysilane, on surfaces of silica particles as described in Japanese Patent Laid-Open No. 2005-162533. Accordingly, colloidal silica (amino group-modified colloidal silica) in which an amino group is immobilized on a surface can be obtained.

Moreover, in the polishing composition of the present invention, the colloidal silica may have an anionic group on the surface. In other words, the colloidal silica may be anionically modified colloidal silica (anion-modified colloidal silica). As the anion-modified colloidal silica, colloidal silica in which an anionic group such as a carboxylic acid group, a sulfonic acid group, a phosphonic acid group, or an aluminate group is immobilized on a surface is a preferable example. A method of manufacturing such colloidal silica having an anionic group is not particularly limited, and a method of causing a silane coupling agent having an anionic group at a terminal and colloidal silica to react, for example, is exemplified.

As a specific example, the method described in "Sulfonic acid-functionalized silica through quantitative oxidation of thiol groups", Chem. Commun. 246 to 247 (2003), for example, can be performed when a sulfonic acid group is immobilized on colloidal silica. Specifically, a silane coupling agent having a thiol group such as 3-mercaptopropyltrimethoxysilane is caused to react with colloidal silica, and then the thiol group is oxidized with hydrogen peroxide, whereby colloidal silica (sulfonic acid-immobilized colloidal silica, sulfonic acid-modified colloidal silica) in which a sulfonic acid group is immobilized on a surface can be obtained.

The method described in "Novel Silane Coupling Agents Containing a Photolabile 2-Nitrobenzyl Ester for Introduction of a Carboxy Group on the Surface of Silica Gel", Chemistry Letters, 3, 228 to 229 (2000), for example, can be performed when the carboxylic acid group is immobilized on colloidal silica. Specifically, a silane coupling agent containing a photoreactive 2-nitrobenzyl ester is coupled to colloidal silica and is then irradiated with light, whereby colloidal silica (carboxylic acid-immobilized colloidal silica, carboxylic acid-modified colloidal silica) in which a carboxylic acid group is immobilized on a surface can be obtained.

Among them, the abrasive grains are preferably anionically modified colloidal silica and are more preferably colloidal silica (sulfonic acid-immobilized colloidal silica, sulfonic acid-modified colloidal silica) in which a sulfonic acid group is immobilized on the surface from the viewpoint that it is possible to further reduce the polishing removal rate of polysilicon and to further reduce defects on the surface of polysilicon after polishing.

The size of the abrasive grains according to the present invention is not particularly limited. For example, an average primary particle size of the abrasive grains is preferably equal to or greater than 5 nm, is more preferably equal to or greater than 10 nm, is further preferably equal to or greater than 15 nm, and is particularly preferably equal to or greater than 20 nm. As the average primary particle size of the colloidal silica increases, the polishing removal rate of the object to be polished by the polishing composition is improved. Also, the average primary particle size of the abrasive grains is preferably equal to or less than 200 nm, is more preferably equal to or less than 150 nm, is further preferably equal to or less than 100 nm, and is particularly preferably equal to or less than 50 nm. As the average primary particle size of the abrasive grains decreases, it becomes easier to obtain a surface with fewer defects by polishing using the polishing composition. In other words, the average primary particle size of the abrasive grains is preferably equal to or greater than 5 nm and equal to or less than 200 nm, is more preferably equal to or greater than 10 nm and equal to or less than 150 nm, is further preferably equal to or greater than 15 nm and equal to or less than 100 nm, and is particularly preferably equal to or greater than 20 nm and equal to or less than 50 nm. Note that the average primary particle size of the abrasive grains can be calculated on the assumption that the shape of the abrasive grain is a true sphere on the basis of the specific surface area (SA) of the abrasive grain calculated by the BET method, for example.

Although an average secondary particle size of the abrasive grains is not particularly limited, the average secondary particle size of the abrasive grains is preferably equal to or greater than 10 nm, is more preferably equal to or greater than 15 nm, is further preferably equal to or greater than 20 nm, and is particularly preferably equal to or greater than 25 nm. As the average secondary particle size of the abrasive grains increases, the resistance during polishing decreases, and stable polishing becomes possible. Also, the average secondary particle size of the abrasive grains is preferably equal to or less than 400 nm, is more preferably equal to or less than 300 nm, is further preferably equal to or less than 200 nm, and is particularly preferably equal to or less than 100 nm. As the average secondary particle size of the abrasive grains decreases, the surface area per unit mass of the abrasive grains increases, a frequency of contact with the object to be polished is improved, and the polishing removal rate is further improved. In other words, the average secondary particle size of the abrasive grains is preferably equal to or greater than 10 nm and equal to or less than 400 nm, is more preferably equal to or greater than 15 nm and equal to or less than 300 nm, is further preferably equal to or greater than 20 nm and equal to or less than 200 nm, and is particularly preferably equal to or greater than 25 nm and equal to or less than 100 nm. Note that the average secondary particle size of the abrasive grains can be measured by a dynamic light scattering method represented by a laser diffraction scattering method, for example.

In addition, an average degree of association of the abrasive grains is preferably equal to or less than 5.0, is more preferably equal to or less than 4.0, and is further preferably equal to or less than 3.0. As the average degree of association of the abrasive grains decreases, defects can be further reduced. In addition, the average degree of association of the abrasive grains is preferably equal to or greater than 1.0, is more preferably equal to or greater than 1.5, and is further preferably equal to or greater than 2.0. There is an advantageous effect that as the average degree of association of the abrasive grains increases, the polishing removal rate of the object to be polished by the polishing composition is improved. In other words, the average degree of association of the abrasive grains is preferably equal to or greater than 1.0 and equal to or less than 5.0, is more preferably equal to or greater than 1.5 and is equal to or less than 4.0, and is further preferably equal to or greater than 2.0 and equal to or less than 3.0. The average degree of association can be obtained by dividing the value of the average secondary particle size of the abrasive grains by the value of the average primary particle size.

Although an upper limit of an aspect ratio of the abrasive grains in the polishing composition is not particularly limited, the upper limit is preferably less than 2.0, is more preferably equal to or less than 1.8, and is further preferably equal to or less than 1.5. Within such a range, defects on the surface of the object to be polished can be further reduced. Note that the aspect ratio is an average of values obtained by taking the smallest rectangles circumscribing images of the abrasive grain particles taken by a scanning electron microscope and dividing the lengths of long sides of the rectangles by the length of short sides of the same rectangles, and can be obtained using general image analysis software. Although a lower limit of the aspect ratio of the abrasive grains in the polishing composition is not particularly limited, the lower limit is preferably equal to or greater than 1.0.

The size (average primary particle size, average secondary particle size, average degree of association, and the like) of the abrasive grains can be appropriately controlled through selection or the like of a method of producing the abrasive grains.

The concentration (content) of the abrasive grains in the polishing composition is not particularly limited. In a case of a polishing composition used as it is for polishing an object to be polished as a polishing liquid (which is typically a slurry polishing liquid, and may also be referred to as a working slurry or a polishing slurry), the lower limit of the concentration (content) of abrasive grains in the polishing composition is preferably equal to or greater than 0.1% by mass, is more preferably equal to or greater than 0.5% by mass, is further preferably equal to or greater than 0.6% by mass, is yet further preferably equal to or greater than 0.8% by mass, and is particularly preferably equal to or greater than 1% by mass with respect to the total mass of the polishing composition. In addition, an upper limit of the concentration (content) of the abrasive grains in the polishing composition is preferably equal to or less than 15% by mass, is more preferably equal to or less than 10% by mass, is further preferably equal to or less than 8% by mass, is yet further preferably equal to or less than 6% by mass, and is particularly preferably equal to or less than 5% by mass with respect to the total mass of the polishing composition.

In other words, in a case of a polishing composition used as it is for polishing an object to be polished as a polishing liquid, the concentration (content) of abrasive grains is preferably equal to or greater than 0.1% by mass and equal to or less than 15% by mass, is more preferably equal to or greater than 0.5% by mass and equal to or less than 10% by mass, is further preferably equal to or greater than 0.6% by mass and equal to or less than 8% by mass, and is yet further preferably equal to or greater than 0.8% by mass and equal to or less than 6% by mass, and is particularly preferably equal to or greater than 1% by mass and equal to or less than 5% by mass with respect to the total mass of the polishing composition.

Also, in a case of a polishing composition diluted and used for polishing (that is, a concentrated solution or an undiluted solution of a working slurry), the concentration (content) of the abrasive grains is typically appropriate when it is equal to or less than 30% by mass, and is more preferably equal to or less than 25% by mass from the viewpoint of storage stability, filterability, and the like. In addition, the concentration (content) of the abrasive grains is preferably greater than 1% by mass and is more preferably equal to or greater than 2% by mass from the viewpoint of taking advantage of forming it as a concentrated solution.

Note that in a case where the polishing composition contains two or more kinds of abrasive grains, the concentration (content) of the abrasive grains means the total amount thereof.

[Removal Rate Inhibitor]

The polishing composition according to the present invention contains a removal rate inhibitor that reduces a polishing removal rate of polysilicon. The removal rate inhibitor can adsorb to the surface of polysilicon to form a protective film, and has an effect of inhibiting mechanical polishing action by abrasive grains.

The removal rate inhibitor is a water-soluble polymer having a polyoxyalkylene chain, the number average molecular weight of which is 200 or more and 600 or less, in which the content of a component with a molecular weight of 700 or more is more than 0% by mass and less than 1% by mass. As examples of the water-soluble polymer having a polyoxyalkylene chain, polyethylene glycol (PEG), polypropylene glycol (PPG), polytetramethylene glycol, polytetramethylene ether glycol, polypentylene glycol, polyhexylene glycol, polyheptylene glycol, polyoctylene glycol, polynonylene glycol, polydecylene glycol, and polyoxyethylene nonylphenyl ether (POE nonylphenyl ether); at least two block copolymers or random copolymers selected from polyethylene glycol, polypropylene glycol, and polytetramethylene glycol; a block copolymer or random copolymer of ethylene oxide and propylene oxide, a block copolymer or random copolymer of ethylene oxide and butylene oxide; a polyglycerin, polyethylene oxide-polyvinyl alcohol graft copolymer; and the like can be exemplified. Among these, the removal rate inhibitor is preferably at least one kind selected from the group consisting of polyethylene glycol, polypropylene glycol, polytetramethylene glycol, and polyglycerin, is more preferably at least one kind selected from the group consisting of polyethylene glycol, polypropylene glycol, and polytetramethylene glycol, and is particularly preferably polypropylene glycol.

The number average molecular weight (Mn) of the water-soluble polymer having a polyoxyalkylene chain is 200 or more and 600 or less. In a case where the number average molecular weight is less than 200, the ability to reduce the polishing removal rate of polysilicon is weak, and adjustment to an arbitrary polishing removal rate of polysilicon may not be achieved. Also, in a case where the number average molecular weight is greater than 600, the water-soluble polymer having a polyoxyalkylene chain is easily adsorbed on polysilicon, attracts organic residues by a hydrophobic interaction, and thereby increases the number of defects. The number average molecular weight of the abrasive grains is preferably equal to or greater than 250, is more preferably equal to or greater than 300, and is further preferably equal to or greater than 350. In addition, the number average molecular weight of the water-soluble polymer having a polyoxyalkylene chain is preferably equal to or less than 580, is more preferably equal to or less than 560, and is further preferably equal to or less than 540. In other words, the number average molecular weight of the water-soluble polymer having a polyoxyalkylene chain is preferably equal to or greater than 250 and equal to or less than 580, is preferably equal to or greater than 300 and equal to or less than 560, and is further preferably equal to or greater than 350 and equal to or less than 540. Note that the number average molecular weight of the water-soluble polymer having a polyoxyalkylene chain can be measured by gel permeation chromatography (GPC), and details of the measurement method will be described in the examples.

Also, in the water-soluble polymer having a polyoxyalkylene chain, the content of a component with a molecular weight of 700 or more is more than 0% by mass and less than 1% by mass. In a case where the content of the component with a molecular weight of 700 or more is 0% by mass, reduction of the polishing removal rate of polysilicon is insufficient. On the other hand, in a case where the content of the component with a molecular weight of 700 or more is equal to or greater than 1% by mass, defects on the surface of polysilicon after polishing increases. The content of the component with a molecular weight of 700 or more is preferably equal to or greater than 0.1% by mass, is more preferably equal to or greater than 0.15% by mass, and is further preferably equal to or greater than 0.2% by mass. In addition, the content of the component with a molecular weight of 700 or more is preferably equal to or less than 0.95% by mass, is more preferably equal to or less than 0.85% by mass, and is further preferably equal to or less than 0.5% by mass. In other words, the content of the component with a molecular weight of 700 or more is preferably equal to or greater than 0.1% by mass and equal to or less than 0.95% by mass, is more preferably equal to or greater than 0.15% by mass and equal to or less than 0.85% by mass, and is further preferably equal to or greater than 0.2% by mass and equal to or less than 0.5% by mass.

The content of the component having a polyoxyalkylene chain and having a molecular weight of 700 or more in the water-soluble polymer can be controlled by performing an activated carbon treatment on the water-soluble polymer having a polyoxyalkylene chain, for example. Specifically, the water-soluble polymer having an arbitrary polyoxyalkylene chain is made into an aqueous solution with an arbitrary concentration, and the activated carbon is then mixed and stirred in the aqueous solution, whereby a component with a molecular weight of 700 or more can be adsorbed to and removed by the activated carbon, for example, according to the method of the activated carbon treatment. After the activated carbon treatment is performed, the used activated carbon can be removed from the aqueous solution of the water-soluble polymer having a polyoxyalkylene chain using a filter. More specifically, it is possible to adopt the method described in the examples.

In addition, it is possible to obtain a water-soluble polymer having a polyoxyalkylene chain in which the content of the target component having a molecular weight of 700 or more is more than 0% by mass and less than 1% by mass by appropriately selecting a mixing mass ratio and mixing two or more kinds of water-soluble polymers having polyoxyalkylene chains, in which content of the components with a molecular weight of 700 or more is different. The temperature and mixing time for mixing are not particularly limited.

Note that the content of the component with a molecular weight of 700 or more in the water-soluble polymer having a polyoxyalkylene chain can be measured by the following method. In other words, an arbitrary water-soluble polymer having an arbitrary polyoxyalkylene chain is separated into each polymer using high performance liquid chromatography (HPLC). Thereafter, a sum of a peak areas of polymers with a molecular weight of 700 or more is divided by a sum of the areas of all the peaks obtained from the water-soluble polymer having a polyoxyalkylene chain, to thereby obtain the content (abundance ratio). More specifically, it can be measured by the method described in the examples.

As the removal rate inhibitor, one kind may be used alone, or two or more kinds may be used in combination. Also, as the removal rate inhibitor, a commercially available product may be used, or a synthetic product may be used.

Although a lower limit of the concentration (content) of the removal rate inhibitor in the polishing composition is not particularly limited, the lower limit is preferably equal to or greater than 0.05% by mass, is more preferably equal to or greater than 0.1% by mass, is further preferably equal to or greater than 0.15% by mass, and is particularly preferably equal to or greater than 0.2% by mass. Also, an upper limit of the concentration (content) of the removal rate inhibitor in the polishing composition is preferably equal to or less than 5% by mass, is more preferably equal to or less than 3% by mass, is further preferably equal to or less than 1% by mass, and is particularly less than 1% by mass. In other words, the concentration (content) of the removal rate inhibitor in the polishing composition is preferably equal to or greater than 0.05% by mass and equal to or less than 5% by mass, is more preferably equal to or greater than 0.1% by mass and equal to or less than 3% by mas, is further preferably equal to or greater than 0.15% by mass and equal to or less than 1% by mass, and is particularly preferably equal to or greater than 0.2% by mass and less than 1% by mass. Note that in a case where the polishing composition contains two or more kinds of removal rate inhibitors, the concentration (content) of the removal rate inhibitors means the total amount thereof.

[Defect Reducing Agent]

The polishing composition according to the present invention contains a defect reducing agent that reduces defects on the surface of polysilicon. The defect reducing agent is adsorbed to the surface of polysilicon and has an action of changing wettability of the polysilicon surface from hydrophobic to hydrophilic. Reattachment of residues and the like to the surface of the object to be polished that has already been polished can be prevented by such an action of the defect reducing agent.

Although the defect reducing agent used in the present invention is not particularly limited as long as it has the above effect, compounds containing an alcoholic hydroxyl group, a carboxy group, an acyloxy group, a sulfo group, a quaternary ammonium structure, a heterocyclic structure, or a vinyl structure in the molecule, for example, are exemplified. The defect reducing agent is preferably a water-soluble polymer having an alcoholic hydroxyl group in a side chain from the viewpoint that it is possible to more easily obtain the effect of the present application.

Although the water-soluble polymer having an alcoholic hydroxyl group in a side chain is not particularly limited, the water-soluble polymer is preferably a compound including a structural moiety represented by a vinyl alcohol unit (—$CH_2$—CH(OH)$^-$·; hereinafter, also referred to as a "VA unit") in the structure.

In the compound containing VA units in the structure, all repeating units may be substantially composed of VA units. Also, the compound containing VA units in the structure may be a compound further containing a non-vinyl alcohol unit (a constitutional unit derived from a monomer other than vinyl alcohol, hereinafter, also referred to as a "non-VA unit") in addition to the VA units. The non-VA unit is not particularly limited, and for example, constitutional units derived from ethylene, vinyl acetate, vinyl propionate, vinyl hexanoate, butenediol, and the like are exemplified. In a case where a polymer containing a constitutional unit derived from vinyl alcohol contains a non-VA unit, the polymer may contain only one kind of non-VA unit, or may contain two or more kinds of non-VA units. Although the ratio of the number of moles of the VA unit to the number of moles of all repeating units in the compound containing VA units in the structure is not particularly limited, the ratio is preferably equal to or greater than 50%, is more preferably equal to or greater than 65%, is further preferably equal to or greater than 70%, and is particularly preferably equal to or greater than 75% (upper limit: 100%).

As the water-soluble polymer having an alcoholic hydroxyl group in the side chain, at least one kind selected from the group consisting of polyvinyl alcohol, a polyvinyl alcohol derivative (a polyvinyl alcohol derivative having an alcoholic hydroxyl group in the side chain), a copolymer of vinyl alcohol and another monomer (a copolymer of vinyl alcohol and another monomer having an alcoholic hydroxyl group in a side chain), and a derivative of the copolymer (a derivative of a copolymer of vinyl alcohol having alcoholic hydroxyl group in side chain and another monomer) is preferable.

Although a degree of saponification of polyvinyl alcohol is not particularly limited, the degree of saponification is preferably equal to or greater than 50% by mole, is more preferably equal to or greater than 65% by mole, is further preferably equal to or greater than 70% by mole, and is particularly preferably equal to or greater than 75% by mole (upper limit: 100% by mole).

As examples of the polyvinyl alcohol derivative, modified polyvinyl alcohol and the like, for example, are exemplified. The modified polyvinyl alcohol includes, as a non-VA unit, a structure in which a part of an alcoholic hydroxyl group of a vinyl alcohol unit is substituted with another functional group (hereinafter, also referred to as "modified VA unit").

Although the modified polyvinyl alcohol is not particularly limited, for example, carboxy-modified polyvinyl alcohol, sulfonic acid-modified polyvinyl alcohol, phosphoric acid-modified polyvinyl alcohol, silanol-modified polyvinyl alcohol, epoxy-modified polyvinyl alcohol, acetoacetyl-modified polyvinyl alcohol, nitrile-modified polyvinyl alcohol, pyrrolidone-modified polyvinyl alcohol, silicone-modified polyvinyl alcohol, amino-modified polyvinyl alcohol, and quaternary ammonium-modified polyvinyl alcohol, and the like are exemplified. Also, although the modified polyvinyl alcohol is not particularly limited, for example, compounds obtained by cyclically acetalizing polyvinyl alcohol (such as polyvinyl butyral, polyvinyl propyral, polyvinyl ethylal, and polyvinyl methylal, for example), or the like are exemplified.

Although the derivative of the copolymer of vinyl alcohol and another monomer is not particularly limited, and compounds further containing, in addition to the VA units and the modified VA units, a constitutional unit such as a constitutional unit derived from ethylene, a constitutional unit derived from vinyl ether having a long chain alkyl group, and a constitutional unit derived from a compound having at least one of an acryloyl group and a methacryloyl group, or the like, are exemplified, for example.

As the water-soluble polymer having an alcoholic hydroxyl group in a side chain, polysaccharides are also preferably used. As examples of polysaccharides, dextrin, maltodextrin, isomaltodextrin (branched maltodextrin), cyclodextrin, branched cyclodextrin, torrefied dextrin, polymeric dextrin, indigestible dextrin, inulin, inulin decomposition product, agavainulin, LM pectin, HM pectin, pullulan, guar gum, guar gum decomposition product, xanthan gum, gum arabic, gum ghatti, native gellan gum, deacylated gellan gum, locust bean gum, tara gum, galactomannan, glucomannan, konjacmanan, curdlan, carrageenan, karaya gum, cassia gum, tamarind seed gum, tragacanth gum, fenugreek gum, psyllium seed gum, succinoglycan, rhamsan gum, alginic acid, sodium alginate, PGA (propylene glycol alginate ester), soybean polysaccharide, methylcellulose, carboxymethyl cellulose, hydroxypropyl cellulose, hydroxypropyl methyl cellulose, agar, fucoidan, porphyran, laminaran, starch, resistant starch, isomaltulose, polydextrose, indigestible glucan, arabinogalactan, and the like are exemplified.

Among these, the defect reducing agent is more preferably at least one kind selected from the group consisting of polyvinyl alcohol, sulfonic acid-modified polyvinyl alcohol, and a butenediol-vinyl alcohol copolymer, and is further preferably a butenediol-vinyl alcohol copolymer.

Although the weight average molecular weight of the defect reducing agent is not particularly limited, the weight average molecular weight is preferably equal to or greater than 1,000, is more preferably equal to or greater than 3,000, and is further preferably equal to or greater than 5,000. Although the weight average molecular weight of the defect reducing agent is not particularly limited, the weight average molecular weight is preferably equal to or less than 1,000,000, is more preferably equal to or less than 100,000, and is further preferably equal to or less than 50,000. In other words, the weight average molecular weight of the defect reducing agent is preferably equal to or greater than 1,000 and equal to or less than 1,000,000, is more preferably equal to or greater than 3,000 and equal to or less than 100,000, is further preferably equal to or greater than 5,000 and equal to or less than 50,000.

As the defect reducing agent, one kind may be used alone, or two or more kinds may be used in combination. Also, as the defect reducing agent, a commercially available product may be used, or a synthetic product may be used.

Although a lower limit of the concentration (content) of the defect reducing agent in the polishing composition is preferably equal to or greater than 0.005% by mass (50 ppm by mass), is more preferably equal to or greater than 0.01% by mass (100 ppm by mass), is further preferably equal to or greater than 0.015% by mass (150 ppm by mass), and is particularly preferably equal to or greater than 0.02% by mass (200 ppm by mass) from the viewpoint of further enhancing hydrophilicity of the object to be polished. Also, an upper limit of the concentration (content) of the defect reducing agent in the polishing composition is preferably equal to or less than 1% by mass (10000 ppm by mass), is more preferably equal to or less than 0.8% by mass (8000 ppm by mass), is further preferably equal to or less than 0.5% by mass (5000 ppm by mass), is yet further preferably equal to or less than 0.3% by mass (3000 ppm by mass), and is particularly preferably equal to or less than 0.1% by mass (1000 ppm by mass). In other words, the concentration (content) of the defect reducing agent in the polishing composition is preferably equal to or greater than 0.005% by mass (50 ppm by mass) and equal to or less than 1% by mass (10000 ppm by mass), is more preferably equal to or greater than 0.01% by mass (100 ppm by mass) and equal to or less than 0.8% by mass (8000 ppm by mass), is further preferably equal to or greater than 0.015% by mass (150 ppm by mass) and equal to or less than 0.5% by mass (5000 ppm by mass), is yet further preferably equal to or greater than 0.02% by mass (200 ppm by mass) and equal to or less than 0.3% by mass (3000 ppm by mass), and is particularly preferably equal to or greater than 0.02% by mass (200 ppm by mass) and equal to or less than 0.1% by mass (1000 ppm by mass). Note that in a case where the polishing composition contains two or more kinds of defect reducing agent, the concentration (content) of the defect reducing agent means a total amount thereof.

[Inorganic Salt]

The polishing composition according to the present invention preferably contains an inorganic salt. The inorganic salt enhances electrical conductivity of the polishing composition and compresses an electric double layer of the surface of the object to be polished (silicon oxide, for example) containing a material other than polysilicon. Therefore, the action of the abrasive grains is improved, and the polishing removal rate of the material other than polysilicon can be improved.

As examples of the inorganic salt, sodium nitrate, potassium nitrate, ammonium nitrate, magnesium nitrate, calcium nitrate, sodium nitrite, potassium nitrite, lithium carbonate, sodium carbonate, potassium carbonate, magnesium carbonate, calcium carbonate, lithium hydrogen carbonate, sodium hydrogen carbonate, potassium hydrogen carbonate, ammonium carbonate, sodium bicarbonate, sodium sulfate, potassium sulfate, ammonium sulfate, calcium sulfate, magnesium sulfate, sodium sulfite, potassium sulfite, potassium sulfite, magnesium sulfite, potassium thiosulfate, lithium sulfate, magnesium sulfate, sodium thiosulfate, sodium hydrogen sulfite, sodium hydrogen sulfate, potassium hydrogen sulfate, lithium fluoride, sodium fluoride, potassium fluoride, calcium fluoride, ammonium fluoride, potassium chloride, sodium chloride, ammonium chloride, calcium chloride, potassium bromide, sodium bromide, ammonium bromide, calcium bromide, sodium iodide, potassium iodide, potassium triiodide, calcium iodide, trilithium phosphate, tripotassium phosphate, trisodium phosphate, triammonium phosphate, sodium monohydrogen phosphate, potassium monohydrogen phosphate, sodium dihydrogen phosphate, potassium dihydrogen phosphate, ammonium dihydrogen phosphate, and the like are exemplified. Among these inorganic salts, one kind may be used alone, or two or more kinds may be used in combination. In addition, as the inorganic salt, a commercially available product may be used, or a synthesized product may be used.

Among these inorganic salts, ammonium sulfate, ammonium nitrate, ammonium carbonate, triammonium phosphate, and diammonium phosphate are preferable in a point that they do not contain metal and halogen. Utilization of an inorganic salt containing neither metal nor halogen leads to advantages such as reduction of metal residues, improvement in handling safety, and prevention of corrosion of the object to be polished.

The concentration (content) of the inorganic salt in the polishing composition is not particularly limited. In a case of a polishing composition used as it is to polish the object to be polished as a polishing solution, a lower limit of the concentration (content) of the inorganic salt in the polishing composition is preferably equal to or greater than 0.2% by mass, is more preferably equal to or greater than 0.3% by mass, is further preferably equal to or greater than 0.4% by mass, and is particularly preferably equal to or greater than 0.5% by mass with respect to the total mass of the polishing composition. In addition, an upper limit of the concentration (content) of the inorganic salt in the polishing composition is preferably equal to or less than 3.0% by mass, is more preferably equal to or less than 2.5% by mass, is further preferably equal to or less than 2.0% by mass, and is particularly preferably equal to or less than 1.5% by mass with respect to the total mass of the polishing composition.

In other words, the concentration (content) of the inorganic salt is preferably equal to or greater than 0.2% by mass and equal to or less than 3.0% by mass, is more preferably equal to or greater than 0.3% by mass and equal to or less than 2.5% by mass, is further preferably equal to or greater than 0.4% by mass and equal to or less than 2.0% by mass, and is particularly preferably equal to or greater than 0.5% by mass and equal to or less than 1.5% by mass with respect to the total mass of the polishing composition. Note that in a case where the polishing composition contains two or more kinds of inorganic salts, the concentration (content) of the inorganic salts means the total amount thereof.

[Dispersing Medium]

The polishing composition according to the present invention preferably further contains a dispersing medium. As examples of the dispersing medium, water; alcohols such as methanol, ethanol, and ethylene glycol; ketones such as acetone; and the like, and mixtures thereof and the like can be exemplified. Among these, water is preferable as the dispersing medium. In other words, according to a more preferred embodiment of the present invention, the dispersing medium contains water. According to a further preferred embodiment of the present invention, the dispersing medium substantially consists of water. Note that "substantially" in the above description is intended to mean that a dispersing medium other than water can be contained as long as the objective effect of the present invention can be achieved, and more specifically, the dispersing medium preferably consists of equal to or greater than 90% by mass and equal to or less than 100% by mass of water and equal to or more than 0% by mass and equal to or less than 10% by mass of a dispersing medium other than water, and more preferably consists of equal to or greater than 99% by mass and equal to or less than 100% by mass of water and equal to or more than 0% by mass and equal to or less than 1% by mass of dispersing medium other than water. Most preferably, the dispersing medium is water.

As the dispersing medium, water that does not contain impurities as much as possible is preferable, and specifically, pure water, ultrapure water, or distilled water from which impurity ions are removed with an ion exchange resin and then foreign substances are removed through a filter is more preferable, from the viewpoint of not inhibiting an action of the components contained in the polishing composition.

[pH and pH Adjusting Agent]

pH of the polishing composition according to the present invention is preferably equal to or greater than 1.0, is more preferably equal to or greater than 1.5, and is further preferably equal to or greater than 2.0 from the viewpoint of safety. In addition, pH is preferably equal to or less than 7.0, is more preferably less than 5.0, is further preferably equal to or less than 4.5, and is particularly preferably equal to or less than 4.0 from the viewpoint of improving the polishing removal rate of the surface of the object to be polished (silicon oxide, for example) containing a material other than polysilicon. In other words, pH of the polishing composition according to the present invention is preferably equal to or greater than 1.0 and equal to or less than 7.0, is more preferably equal to or greater than 1.5 and less than 5.0, is further preferably equal to or greater than 1.5 and equal to or less than 4.5, and is particularly preferably equal to or greater than 2.0 and equal to or less than 4.0.

The polishing composition according to the present invention may contain a pH adjusting agent for adjusting pH. The pH adjusting agent may be either an acid or a base and may be either an inorganic compound or an organic compound. As the pH adjusting agent, one kind may be used alone, or two or more kinds may be used in combination.

As specific examples of the acid that can be used as the pH adjusting agent, inorganic acids such as a hydrochloric acid, a sulfuric acid, a nitric acid, a hydrofluoric acid, a boric acid, a carbonic acid, a hypophosphorous acid, a phosphorous acid, and a phosphoric acid; and organic acids such as a formic acid, an acetic acid, a propionic acid, a butyric acid, a valeric acid, a 2-methylbutyric acid, an n-hexanoic acid, a 3,3-dimethylbutyric acid, a 2-ethylbutyric acid, a 4-methylpentanoic acid, an n-heptanoic acid, a 2-methylhexanoic acid, an n-octanoic acid, a 2-ethylhexanoic acid, a benzoic acid, a glycolic acid, a salicylic acid, a glyceric acid, an oxalic acid, a malonic acid, a succinic acid, a glutaric acid, an adipic acid, a pimelic acid, a maleic acid, a phthalic acid, a malic acid, tartaric acid, a citric acid, a lactic acid, a diglycolic acid, a 2-furancarboxylic acid, a 2,5-furandicarboxylic acid, a 3-furancarboxylic acid, a 2-tetrahydrofurancarboxylic acid, a methoxyacetic acid, a methoxyphenylacetic acid, and a phenoxyacetic acid are exemplified.

As the base that can be used as the pH adjusting agent, organic bases such as amines such as aliphatic amines and aromatic amines and quaternary ammonium hydroxide; and inorganic bases such as hydroxides of alkali metals such as sodium hydroxide and potassium hydroxide, hydroxides of Group 2 elements, and ammonia are exemplified.

The amount of addition of the pH adjusting agent is not particularly limited and may be appropriately adjusted such that the polishing composition has a desired pH. In addition, pH of the polishing composition can be measured by a pH meter, for example, and specifically, can be measured by the method described in the examples.

[Electrical Conductivity of Polishing Composition]

Although electrical conductivity (EC) of the polishing composition according to the present invention is not particularly limited, the electrical conductivity is preferably equal to or greater than 1 mS/cm and is more preferably equal to or greater than 3 mS/cm. Also, the electrical conductivity (EC) of the polishing composition according to the present invention is preferably equal to or less than 20 mS/cm and is more preferably equal to or less than 15 mS/cm. In other words, the electrical conductivity (EC) of the polishing composition according to the present invention is preferably equal to or greater than 1 mS/cm and equal to or less than 20 mS/cm and is more preferably equal to or greater than 3 mS/cm and equal to or less than 15 mS/cm. When the electrical conductivity (EC) of the polishing composition is within such a range, the polishing removal rate of the material (silicon oxide, for example) other than polysilicon can be improved. In addition, repulsion between the abrasive grains can be appropriately adjusted, and stability can be secured. The electrical conductivity of the polishing composition can be adjusted by the types, the amounts, and the like of the inorganic salt, the pH adjusting agent, and the like. The electrical conductivity (EC) of the polishing composition can be measured by the method described in the examples.

[Other Components]

The polishing composition of the present invention may further contain other components such as a complexing agent, a metal anticorrosive, an antiseptic agent, an antifungal agent, an oxidizing agent, a reducing agent, and a surfactant as needed. Hereinafter, the antiseptic agent and the antifungal agent which are preferable components will be described.

(Antiseptic Agent and Antifungal Agent)

As the antiseptic agent and the antifungal agent that can be added to the polishing composition according to the present invention, isothiazoline-based antiseptic agents such as 2-methyl-4-isothiazoline-3-one and 5-chloro-2-methyl-4-isothiazoline-3-one, paraoxybenzoic acid esters, phenoxyethanol, and the like are exemplified, for example. Among these antiseptic agents and antifungal agents, one kind may be used alone, or two or more kinds may be used in combination.

<Form of Polishing Composition>

The polishing composition according to the present invention is typically supplied to an object to be polished in the form of a polishing liquid containing the polishing composition and used for polishing the object to be polished. For example, the polishing composition according to the present invention may be diluted (typically diluted with water) and used as a polishing liquid, or may be used as it is as a polishing liquid. In other words, the concept of the polishing composition according to the present invention includes both a polishing composition (working slurry) supplied to the object to be polished and used for polishing the object to be polished and a concentrated solution (an undiluted solution of the working slurry) diluted and used as a polishing liquid. The concentration ratio of the concentrated solution can be, for example, equal to or greater than about 2 times and equal to or less than 100 times and is typically appropriate when it is equal to or greater than about 3 times and equal to or less than 50 times by volume.

[Object to be Polished]

The object to be polished according to the present invention is not particularly limited, and single crystal silicon, polycrystalline silicon (polysilicon), polycrystalline silicon doped with an n-type or p-type impurity, amorphous silicon (amorphous silicon), amorphous silicon doped with an n-type or p-type impurity, silicon oxide, silicon nitride, silicon carbonitride (SiCN), metal, SiGe, a carbon-containing material, and the like are exemplified, for example.

As examples of the object to be polished containing silicon oxide, a TEOS type silicon oxide film (hereinafter, also simply referred to as "TEOS" or a "TEOS film") generated using tetraethyl orthosilicate as a precursor, an HDP (High Density Plasma) film, a USG (Undoped Silicate Glass) film, a PSG (Phosphorus Silicate Glass) film, a BPSG (Boron-Phospho Silicate Glass) film, a RTO (Rapid Thermal Oxidation) film, and the like are exemplified, for example.

As the metal, tungsten, copper, aluminum, cobalt, hafnium, nickel, gold, silver, platinum, palladium, rhodium, ruthenium, iridium, osmium, and the like are exemplified, for example.

As the carbon-containing material, amorphous carbon (amorphous carbon), spin-on carbon (SOC), diamond-like carbon (DLC), nanocrystalline diamond, and graphene; SiOC (carbon-containing silicon oxide obtained by doped $SiO_2$ with C) which is a low dielectric constant (Low-k) material, silicon carbide, and the like are exemplified, for example. The film containing the carbon-containing material can be formed by CVD, PVD, a spin coating method, or the like.

As the object to be polished, a commercially available product may be used, or an object may be manufactured by a known method.

Among these, an object to be polished containing polysilicon is preferable. Therefore, according to a preferred embodiment of the present invention, the polishing composition is used for polishing an object to be polished containing polysilicon.

[Method of Manufacturing Polishing Composition]

A method of manufacturing the polishing composition according to the present embodiment is not particularly limited, and the polishing composition can be obtained by stirring and mixing the abrasive grains, the removal rate inhibitor, the defect reducing agent, and other additives added as needed, for example. Details of each component are as described above.

Although the temperature at which each component is mixed is not particularly limited, the temperature is preferably equal to or greater than 10° C. and is equal to or less than 40° C., and heating may be performed to raise the rate of dissolution. Moreover, the mixing time is also not particularly limited as long as the components can be uniformly mixed.

[Polishing Method and Method of Manufacturing Semiconductor Substrate]

The polishing composition according to the present invention is particularly suitably used to polish an object to be polished containing polysilicon as described above. Therefore, the present invention provides a method of polishing an object to be polished containing polysilicon with the polishing composition according to the present embodiment. Additionally, the present invention also provides a method of manufacturing a semiconductor substrate including a process of polishing a semiconductor substrate containing polysilicon by the polishing method described above.

As a polishing apparatus, it is possible to use a general polishing apparatus, to which a holder for holding a substrate or the like having an object to be polished and a motor or the like capable of changing the number of revolutions are attached, which has a polishing table that allows a polishing pad (polishing cloth) to be attached thereto.

As the polishing pad, a general nonwoven fabric, polyurethane, a porous fluororesin, or the like can be used without particular limitation. The polishing pad is preferably subjected to groove processing such that a polishing liquid is accumulated.

In regard to polishing conditions, rotation speeds of the polishing table (platen) and the carrier (head) are preferably equal to or greater than 10 rpm ($0.17\ s^{-1}$) and equal to or less than 500 rpm ($8.33\ s^{-1}$). The pressure (polishing pressure) to be applied to the substrate having the object to be polished is preferably equal to or greater than 0.5 psi (3.45 kPa) and equal to or less than 10 psi (68.9 kPa).

A method of supplying the polishing composition to the polishing pad is also not particularly limited, and for example, a method of continuously supplying the polishing composition by a pump or the like is adopted. Although the amount of supply is not limited, it is preferable that the surface of the polishing pad be constantly covered with the polishing composition according to the present invention.

The polishing composition according to the present embodiment may be a one-pack type or a multi-pack type including a two-pack type. In addition, the polishing composition according to the present invention may be prepared by diluting an undiluted solution of the polishing composition three times or more, for example, using a diluent such as water.

[Polishing Removal Rate]

As described above, the polishing composition according to the present invention can reduce a polishing removal rate of polysilicon. Specifically, the polishing removal rate of polysilicon is preferably equal to or less than 35 Å/min, is more preferably equal to or less than 32 Å/min, and is further preferably equal to or less than 30 Å/min. Note that 1 Å=0.1 nm.

[Number of Defects]

As described above, the polishing composition according to the present invention can reduce the number of defects on the surface of polysilicon after polishing is finished. Specifically, the number of defects of equal to or greater than 0.08 μm is preferably equal to or less than 10000, is more preferably equal to or less than 5000, and is further preferably equal to or less than 3000 (lower limit: 0). Note that the number of defects is a value measured by the method described in the examples.

Although the embodiment of the present invention has been described in detail, this is illustrative and exemplary and not restrictive, and it is obvious that the scope of the present invention should be interpreted by the appended claims.

The present invention includes the following aspects and forms.

1. A polishing composition containing: abrasive grains; a removal rate inhibitor that reduces a polishing removal rate of polysilicon; and a defect reducing agent that reduces defects on a surface of polysilicon, wherein the removal rate inhibitor is a water-soluble polymer having a polyoxyalkylene chain, a number average molecular weight of which is 200 or more and 600 or less, in which content of a component with a molecular weight of 700 or more is more than 0% by mass and less than 1% by mass.
2. The polishing composition according to 1 above, in which the water-soluble polymer having a polyoxyalkylene chain is polypropylene glycol.
3. The polishing composition according to 1 or 2 above, in which the defect reducing agent is a water-soluble polymer having an alcoholic hydroxyl group in a side chain.
4. The polishing composition according to any one of 1 to 3 above, in which the abrasive grains are anionically modified colloidal silica.
5 The polishing composition according to any one of 1 to 4 above, in which pH is equal to or greater than 1.0 and less than 5.0.
6. The polishing composition according to any one of 1 to 5 above, further containing: an inorganic salt.
7. The polishing composition according to any one of 1 to 6 above, further containing: a dispersing medium.
8. The polishing composition according to any one of 1 to 8 above, in which the polishing composition is used for polishing an object to be polished containing polysilicon.
9. A polishing method including: polishing an object to be polished containing polysilicon using the polishing composition according to any one of 1 to 8 above.
10. A method of manufacturing a semiconductor substrate including: polishing a semiconductor substrate containing polysilicon by the polishing method according to 9 above.

EXAMPLES

The present invention will be described in more detail with reference to the following examples and comparative examples. However, the technical scope of the present invention is not limited only to the following examples. Unless otherwise particularly specified, and "part" mean "% by mass" and "part by mass", respectively. In addition, unless otherwise particularly specified, operations were performed under conditions of room temperature (equal to or greater than 20° C. and equal to or less than 25° C.)/relative humidity of equal to or greater than 40% RH and equal to or less than 50% RH. Note that each physical property was measured as follows.

<Average Secondary Particle Size of Abrasive Grains>

The average secondary particle size of the abrasive grains was calculated as a volume average particle size (volume-based arithmetic average diameter; Mv) by a dynamic light scattering particle size/particle size distribution apparatus UPA-UT151 (manufactured by Nikkiso Co., Ltd.).

<Zeta Potential of Abrasive Grains>

Measurement of a zeta potential of the abrasive grains was performed using a zeta potential measuring apparatus (trade name "ELS-Z") manufactured by Otsuka Electronics Co., Ltd.

<pH of Polishing Composition> pH of the polishing composition was measured using a glass electrode type hydrogen ion concentration indicator (manufactured by Horiba, Ltd., model number: F-23). Specifically, after three-point calibration was carried out using a standard buffer solution (phthalate pH buffer pH: 4.01 (25° C.), neutral phosphate pH buffer pH: 6.86 (25° C.), carbonate pH buffer pH: 10.01 (25° C.)), a glass electrode was placed in the polishing composition, and a pH value measured after elapse of 2 minutes or more and stabilization was adopted.

<Measurement of Number Average Molecular Weight of Removal Rate Inhibitor (Water-Soluble Polymer Having Polyoxyalkylene Chain) and Content of Component with Molecular Weight of 700 or More>

Method of Examining Abundance Ratio of Each Polymer in Water-Soluble Polymer Having Polyoxyalkylene Chain (Separation of Removal Rate Inhibitor with High-Performance Liquid Chromatography)

Samples of the water-soluble polymer having a polyoxyalkylene chain in the examples and the comparative examples were separated at peaks of the respective polymers using UltiMate 3000+CAD manufactured by Thermo Fisher Scientific. TSKgel (registered trademark) Octadecyl-2PW manufactured by Tosoh Corporation was used as a column, water and acetonitrile were used as an eluent, and separation was performed at the peak of each polymer using a gradient method under conditions of an oven temperature of 30° C. and a flow rate of 0.6 ml/min. As for an abundance ratio of each polymer, the abundance ratio was obtained by dividing a peak area of an arbitrary polymer by a sum of the areas of all the peaks obtained from the water-soluble polymer having a polyoxyalkylene chain. The number average molecular weight of the water-soluble polymer having a polyoxyalkylene chain was obtained, from the abundance ratio of each polymer in the water-soluble polymer having a polyoxyalkylene chain obtained using high-performance liquid chromatography (HPLC), as a sum of products of the molecular weight of the polymer and the abundance ratio of the polymer.

<Weight Average Molecular Weight of Polymer Other than Removal Rate Inhibitor>

As a weight average molecular weight of the polymer other than the removal rate inhibitor, a value of a weight average molecular weight (in terms of polyethylene glycol) measured by gel permeation chromatography (GPC) was used. The weight average molecular weight was measured by the apparatus and under the conditions described below.

GPC apparatus: manufactured by Shimadzu Corporation
Model: Prominence+ELSD detector (ELSD-LTII)
Column: VP-ODS (manufactured by Shimadzu Corporation)
Mobile phase A: MeOH
B: 1% acetic acid aqueous solution
Flow rate: 1 mL/min
Detector: ELSD temp. 40° C., Gain 8, $N_2$GAS 350 kPa
Oven temperature: 40° C.
Injection volume: 40 μL <Electrical Conductivity of Polishing Composition>

Electrical conductivity (EC) of the polishing composition was measured by a tabletop electrical conductivity meter (manufactured by HORIBA, Ltd., model number: DS-71 LAQUA (registered trademark)).

<Sulfonic Acid-Immobilized Colloidal Silica>

As sulfonic acid-immobilized colloidal silica contained in the polishing composition, colloidal silica produced by the method described in "Sulfonic acid-functionalized silica through quantitative oxidation of thiol groups", Chem. Commun. 246 to 247 (2003) using colloidal silica with an average secondary particle size of 68.9 nm.

<Polypropylene Glycol>

As polypropylene glycol, the following six types (PPG1 to PPG6) were prepared:

Polypropylene glycol 1 (also referred to as PPG1): polypropylene glycol containing 1.06% by mass of component with a molecular weight of 700 or more and having a number average molecular weight of 489.9

Polypropylene glycol 2 (also referred to as PPG2): polypropylene glycol containing 0% by mass of component with a molecular weight of 700 or more and having a number average molecular weight of 482.2 by performing an activated carbon treatment on above PPG1

A treatment of removing a high-molecular-weight product of polypropylene glycol (water-soluble polymer having a polyoxyalkylene chain) by activated carbon was performed using KURARAY COLL (registered trademark) GW-H which was an activated carbon manufactured by KURARAY Co., Ltd. More specifically, the activated carbon was cleaned with pure water, was then mixed with a 12% by mass aqueous solution of polypropylene glycol (water-soluble polymer having a polyoxyalkylene chain) to be treated, and was stirred for 2 hours to thereby cause the activated carbon to adsorb a high-molecular-weight component. A 0.2 μm membrane filter of Ultipore (registered trademark) N66 manufactured by Pall Corporation was used to remove the activated carbon, and separation into activated carbon and a polypropylene glycol aqueous solution was achieved by suction filtration.

Polypropylene glycol 3 (also referred to as PPG3): polypropylene glycol containing 2.22% by mass of component with a molecular weight of 700 or more and having a number average molecular weight of 491.8

Polypropylene glycol 4 (also referred to as PPG4): polypropylene glycol containing 2.97% by mass of component with a molecular weight of 700 or more and having a number average molecular weight of 534.3

Polypropylene glycol 5 (also referred to as PPG5): polypropylene glycol containing 1.44% by mass of component with a molecular weight of 700 or more and having a number average molecular weight of 518.3

Polypropylene glycol 6 (also referred to as PPG6): polypropylene glycol containing 1.00% by mass of component with a molecular weight of 700 or more and having a number average molecular weight of 498.8

Example 1

<Preparation of Polishing Composition>

PPG1 and PPG2 described above were mixed at a mass ratio of PPG1:PPG2=75:25 to prepare a removal rate inhibitor 1 (mixing temperature: 25° C., mixing time: 10 minutes). The number average molecular weight of the obtained removal rate inhibitor 1 was 496.4, and the content of the component with a molecular weight of 700 or more was 0.82% by mass.

The sulfonic acid-immobilized colloidal silica (average secondary particle size: 68.9 nm) prepared as described above was added to water as a dispersing medium such that a final concentration was 2.3% by mass. Furthermore, the removal rate inhibitor 1 was added such that a final concentration was 0.6% by mass, a butenediol-vinyl alcohol copolymer (polymerization degree: 300, manufactured by Mitsubishi Chemical Corporation, product name: Nichigo-G polymer AZF8035W) as a defect reducing agent was added such that a final concentration was 750 ppm by mass, and ammonium sulfate (manufactured by Tomiyama Pure Chemical Industries, Ltd.) as an inorganic salt was added such that a final concentration was 0.5% by mass, and stirring and mixing were performed (stirring temperature: 25° C., stirring time: 20 minutes). pH of the polishing composition was adjusted to pH2.1 using a nitric acid to complete a polishing composition 1. The zeta potential of the sulfonic acid-immobilized colloidal silica in the polishing composition 1 was −55 mV, and the electrical conductivity (EC) of the polishing composition 1 was 12.0 mS/cm.

Example 2

PPG1 and PPG2 described above were mixed at a mass ratio of PPG1:PPG2=90:10 to prepare a removal rate inhibitor 2. The number average molecular weight of the obtained removal rate inhibitor 2 was 498.9, and the content of the component with a molecular weight of 700 or more was 0.95% by mass.

A polishing composition 2 was prepared by a method that was similar to that in Example 1 other than that that the removal rate inhibitor 2 obtained as described above was used instead of the removal rate inhibitor 1.

Example 3

PPG1 and PPG2 described above were mixed at a mass ratio of PPG1:PPG2=85:15 to prepare a removal rate inhibitor 3. The number average molecular weight of the obtained removal rate inhibitor 3 was 497.5, and the content of the component with a molecular weight of 700 or more was 0.89% by mass.

A polishing composition 3 was prepared by a method that was similar to that in Example 1 other than that that the removal rate inhibitor 3 obtained as described above was used instead of the removal rate inhibitor 1.

Example 4

PPG1 and PPG2 described above were mixed at a mass ratio of PPG1:PPG2=45:55 to prepare a removal rate inhibitor 4. The number average molecular weight of the obtained removal rate inhibitor 4 was 493.7, and the content of the component with a molecular weight of 700 or more was 0.47% by mass.

A polishing composition 4 was prepared by a method that was similar to that in Example 1 other than that that the removal rate inhibitor 4 obtained as described above was used instead of the removal rate inhibitor 1.

Example 5

PPG1 and PPG2 described above were mixed at a mass ratio of PPG1:PPG2=30:70 to prepare a removal rate inhibitor 5. The number average molecular weight of the obtained removal rate inhibitor 5 was 489.9, and the content of the component with a molecular weight of 700 or more was 0.31% by mass.

A polishing composition 5 was prepared by a method that was similar to that in Example 1 other than that that the removal rate inhibitor 5 obtained as described above was used instead of the removal rate inhibitor 1.

Comparative Example 1

A polishing composition comparison 1 was prepared by a method that was similar to that in Example 1 other than that that PPG2 was used as the removal rate inhibitor instead of the removal rate inhibitor 1.

Comparative Example 2

A polishing composition comparison 2 was prepared by a method that was similar to that in Example 1 other than that that PPG3 was used as the removal rate inhibitor instead of the removal rate inhibitor 1.

Comparative Example 3

A polishing composition comparison 3 was prepared by a method that was similar to that in Example 1 other than that that PPG4 was used as the removal rate inhibitor instead of the removal rate inhibitor 1.

Comparative Example 4

A polishing composition comparison 4 was prepared by a method that was similar to that in Example 1 other than that that PPG5 was used as the removal rate inhibitor instead of the removal rate inhibitor 1.

Comparative Example 5

A polishing composition comparison 5 was prepared by a method that was similar to that in Example 1 other than that that PPG1 was used as the removal rate inhibitor instead of the removal rate inhibitor 1.

Comparative Example 6

A polishing composition comparison 6 was prepared by a method that was similar to that in Example 1 other than that that PPG6 was used as the removal rate inhibitor instead of the removal rate inhibitor 1.

[Evaluation]

As an object to be polished, an object obtained by forming a polysilicon film having a thickness of 5000 Å on a surface of a silicon wafer (300 mm, blanket wafer) was prepared. The object to be polished was polished under the following conditions using the polishing compositions obtained in the examples and the comparative examples described above.

<Polishing Conditions>

Polishing machine: 300 mm polishing machine (Ebara Corporation, model number: F-REX300E)
Polishing pad: pad made of polyurethane (IC1000 manufactured by Nitta DuPont Co., Ltd.)
Pressure: 2.0 psi (13.79 kPa)
Polishing table (platen) rotation speed: 31 rpm
Carrier (head) rotation speed: 30 rpm
Supply of polishing composition: one-way
Flow rate of polishing composition: 200 ml/min Polishing time: 60 seconds <Polishing Removal Rate>

The polishing removal rate (polishing rate) of the object to be polished was calculated by the following equation.

$$\text{Polishing removal rate } [\text{Å/min}] = (\text{film thickness before polishing } [\text{Å}] - \text{film thickness after polishing } [\text{Å}])/\text{polishing time } [\text{min}] \quad \text{[Math. 1]}$$

The film thicknesses of the object to be polished before and after polishing were obtained by a light interference type film thickness measurement apparatus (manufactured by KLA-Tencor Corporation, model number: ASET-F5X), and the polishing removal rate was calculated by dividing the difference by the polishing time.

(Cleaning Device and Cleaning Conditions)

After the object to be polished was polished under the above polishing conditions, the object to be polished that had already been polished was removed from the polishing table (platen). Subsequently, the object to be polished that had already been polished was cleaned by a cleaning method of rubbing the object to be polished that had already been polished under the following conditions while a pressure was applied with a sponge which had been made of polyvinyl alcohol (PVA) and was a cleaning brush, using the following cleaning liquid:

Apparatus: 300 mm polishing machine (Ebara Corporation, model number: F-REX300E)
Cleaning solution: 0.3% by mass ammonia water
Cleaning brush rotation speed: 100 rpm
Rotation speed of object to be cleaned (object to be polished that had already been polished): 100 rpm
Flow rate of cleaning solution: 1000 mL/min
Cleaning time: 20 seconds As for the surface of the object to be polished obtained through the above cleaning, the number of defects (the number of organic residues) of equal to or greater than 0.08 μm was evaluated according to the following method. Specifically, defects of equal to or greater than 0.08 μm were detected on the entire surface of the object to be polished (except for the outer circumference of 5 mm) using a defect detection apparatus (wafer inspection apparatus) "Surfscan SP5" manufactured by KLA-TENCOR Co., Ltd. The number of organic residues was counted by observing all the detected defects with a review SEM(RS-6000, manufactured by Hitachi High-Technologies Corporation).

Configurations and evaluation results of the polishing compositions in the examples and the comparative examples are shown in Table 1 below. Note that in Table 1 below, description of inorganic salts and a pH adjusting agent is omitted.

TABLE 1

| | Polishing composition No. | Abrasive grain: Average secondary particle size (nm) | Abrasive grain: Zeta potentiel (mV) | Abrasive grain: Concentration (% by mass) | Removal rate inhibitor: Type | Removal rate inhibitor: Mn | Removal rate inhibitor: Content of component with molecular weight of 700 or more (% by mass) | Removal rate inhibitor: Concentration (% by mass) |
|---|---|---|---|---|---|---|---|---|
| Example 1 | 1 | 68.9 | −55 | 2.3 | Removal rate inhibitor 1 | 496.4 | 0.82 | 0.6 |
| Example 2 | 2 | 68.9 | −55 | 2.3 | Removal rate inhibitor 2 | 498.9 | 0.95 | 0.6 |
| Example 3 | 3 | 68.9 | −55 | 2.3 | Removal rate inhibitor 3 | 497.5 | 0.89 | 0.6 |
| Example 4 | 4 | 68.9 | −55 | 2.3 | Removal rate inhibitor 4 | 493.7 | 0.47 | 0.6 |
| Example 5 | 5 | 68.9 | −55 | 2.3 | Removal rate inhibitor 5 | 489.9 | 0.31 | 0.6 |
| Comparative Example 1 | Comparison 1 | 68.9 | −55 | 2.3 | PPG2 | 482.2 | 0 | 0.6 |
| Comparative Example 2 | Comparison 2 | 68.9 | −55 | 2.3 | PPG3 | 491.8 | 2.22 | 0.6 |
| Comparative Example 3 | Comparison 3 | 68.9 | −55 | 2.3 | PPG4 | 534.3 | 2.97 | 0.6 |
| Comparative Example 4 | Comparison 4 | 68.9 | −55 | 2.3 | PPG5 | 518.3 | 1.44 | 0.6 |
| Comparative Example 5 | Comparison 5 | 68.9 | −55 | 2.3 | PPG1 | 489.9 | 1.06 | 0.6 |
| Comparative Example 6 | Comparison 6 | 68.9 | −55 | 2.3 | PPG6 | 498.8 | 1.00 | 0.6 |

| | Defect reducing agent: Type | Defect reducing agent: Concentration (ppm by mass) | Polishing composition: pH | Polishing composition: EC (mS/cm) | Evaluation: Number of defects | Evaluation: Polysilicon polishing removal rate (Å/min) |
|---|---|---|---|---|---|---|
| Example 1 | AZF8035W | 750 | 2.1 | 12.0 | 860 | 24 |
| Example 2 | AZF8035W | 750 | 2.1 | 12.0 | 3897 | 25 |
| Example 3 | AZF8035W | 750 | 2.1 | 12.0 | 2049 | 24 |
| Example 4 | AZF8035W | 750 | 2.1 | 12.0 | 551 | 25 |
| Example 5 | AZF8035W | 750 | 2.1 | 12.0 | 489 | 25 |
| Comparative Example 1 | AZF8035W | 750 | 2.1 | 12.0 | 571 | 41 |
| Comparative Example 2 | AZF8035W | 750 | 2.1 | 12.0 | 24832 | 25 |
| Comparative Example 3 | AZF8035W | 750 | 2.1 | 12.0 | 17917 | 25 |
| Comparative Example 4 | AZF8035W | 750 | 2.1 | 12.0 | 93184 | 29 |
| Comparative Example 5 | AZF8035W | 750 | 2.1 | 12.0 | 19934 | 28 |
| Comparative Example 6 | AZF8035W | 750 | 2.1 | 12.0 | 86439 | 27 |

As is apparent from Table 1 above, it was found that in the case where the polishing compositions in the examples were used, it was possible to reduce defects (organic residues, for example) on the polysilicon surface while reducing the polishing removal rate of polysilicon. It was found that in the case of the polishing composition in Comparative Example 1 containing the removal rate inhibitor in which the content of the component with a molecular weight of 700 or more was 0% by mass, the reduction of the polishing removal rate of polysilicon was insufficient although the number of defects was reduced. It was found that in the case of the polishing compositions in Comparative Examples 2 to 6 containing the removal rate inhibitors in which the content of the component with a molecular weight of 700 or more was equal to or greater than 1% by mass, the number of defects increased although it was possible to reduce the polishing removal rate of polysilicon.

The present application is based on Japanese Patent Application No. 2023-169594 filed on Sep. 29, 2023, the disclosure content of which is incorporated herein by reference in entirety thereof.

What is claimed is:

1. A polishing composition comprising:

abrasive grains;

a removal rate inhibitor that reduces a polishing removal rate of polysilicon; and a defect reducing agent that reduces defects on a surface of polysilicon;

wherein the removal rate inhibitor is a water-soluble polymer having a polyoxyalkylene chain, which has a number average molecular weight of 200 or more and 600 or less, in which a content of the water-soluble polymer having a polyalkylene chain with a molecular weight of 700 or more relative to a total mass of the water-soluble polymer having a polyoxyalkylene chain is more than 0% by mass and less than 1% by mass.

2. The polishing composition according to claim 1, wherein the water-soluble polymer having a polyoxyalkylene chain is polypropylene glycol.

3. The polishing composition according to claim 1, wherein the defect reducing agent is a water-soluble polymer having an alcoholic hydroxyl group in a side chain.

4. The polishing composition according to claim 1, wherein the abrasive grains are anionically modified colloidal silica.

5. The polishing composition according to claim 1, wherein pH is equal to or greater than 1.0 and less than 5.0.

6. The polishing composition according to claim 1, further comprising an inorganic salt.

7. The polishing composition according to claim 1, further comprising a dispersing medium.

8. The polishing composition according to claim 1, wherein the polishing composition is used for polishing an object to be polished containing polysilicon.

9. A polishing method comprising: polishing an object to be polished containing polysilicon using the polishing composition according to claim 1.

10. A method of manufacturing a semiconductor substrate comprising: polishing a semiconductor substrate containing polysilicon by the polishing method according to claim 9.

11. The polishing composition according to claim 1, wherein a content of the water-soluble polymer having a polyoxyalkylene chain with a molecular weight of 700 or more relative to a total mass of the water-soluble polymer having a polyoxyalkylene chain is 0.1% by mass or more and 0.95% by mass or less.

12. The polishing composition according to claim 1, wherein a content of the water-soluble polymer having a polyoxyalkylene chain with a molecular weight of 700 or more relative to a total mass of the water-soluble polymer having a polyoxyalkylene chain is 0.31% by mass or more and 0.95% by mass or less.

* * * * *